United States Patent [19]

Masaki

[11] Patent Number: 4,757,419
[45] Date of Patent: Jul. 12, 1988

[54] APPARATUS FOR GENERATING PULSE LINE OF MAGNETIC FORCE

[75] Inventor: Kazumi Masaki, Osaka, Japan

[73] Assignee: Ken Hayashibara, Okayama, Japan

[21] Appl. No.: 40,832

[22] Filed: Apr. 9, 1987

Related U.S. Application Data

[63] Continuation of Ser. No. 697,637, Feb. 4, 1985, abandoned.

[30] Foreign Application Priority Data

Feb. 22, 1984 [JP] Japan .................... 59-33155

[51] Int. Cl.⁴ .............................. H01F 7/18
[52] U.S. Cl. ............................. 361/156
[58] Field of Search ........... 361/139, 155, 156, 267

[56] References Cited

U.S. PATENT DOCUMENTS

| | | | |
|---|---|---|---|
| 4,219,863 | 8/1980 | Takeshima | 361/156 |
| 4,527,216 | 7/1985 | Stammely | 361/156 |
| 4,539,619 | 9/1985 | Hill | 361/155 X |
| 4,621,299 | 11/1986 | Hill | 361/267 X |

FOREIGN PATENT DOCUMENTS

| | | |
|---|---|---|
| 0028090 | 5/1981 | European Pat. Off. . |
| 0041118 | 9/1981 | European Pat. Off. . |
| 0101389 | 2/1984 | European Pat. Off. . |
| 1106746 | of 1968 | United Kingdom . |
| 1204023 | of 1970 | United Kingdom . |
| 1355213 | of 1974 | United Kingdom . |
| 2016226 | 9/1979 | United Kingdom . |
| 2130001 | 5/1984 | United Kingdom . |

*Primary Examiner*—Michael L. Gellner
*Attorney, Agent, or Firm*—Browdy & Neimark

[57] ABSTRACT

The series resonance of a conventional magnetic pulse generator having a loop circuit including a capacitance, a thyristor and an inductance is reduced by connecting a diode in parallel with the capacitance, or to in reverse parallel with the thyristor. Thus a magnetic pulse can be created via the inductor, while substantially reducing the charge current for the capacitor and eliminating a voltage pulse across the capacitor opposite in polarity to that of the charged state of the capacitor for producing the magnetic pulse.

2 Claims, 2 Drawing Sheets

APPARATUS FOR GENERATING PULSE LINE OF MAGNETIC FORCE

This application is a continuation of application Ser. No. 697,637, filed 4 Feb. 1985, now abandoned.

FIELD OF THE INVENTION

The present invention relates to an apparatus for generating with a relatively small electricity a pulse line of magnetic force.

BACKGROUND OF THE INVENTION

In conventional magnetic force impulse generator wherein the discharge current of a capacitance is applied to a coil member through a switching device, such as thyristor, the coil member and capacitance inevitably form a series resonant circuit to generate a vibration current. The negative voltage of the charge current, however, is still in the capacitance since such switching device passes a current for positive polarity of the current. In the next charge of the capacitance, a high rush current and a large quantity of electricity are required to cancel the negative voltage in order to charge the capacitance to a positive level.

Figure 1:
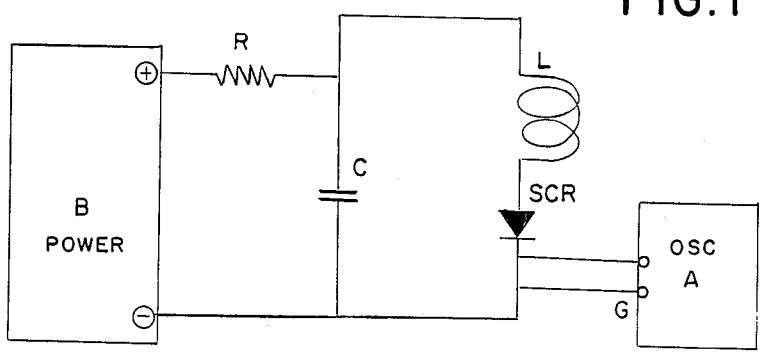
FIG. 1 shows the circuit diagram of conventional generator.

In the drawings, A means a low-frequency oscillator; B, power source; C, capacitance; D, diode; G, triggering voltage; L, coil for generating pulse lines of magnetic force; R, resistance; and SCR, thyristor.

DESCRIPTION OF THE PREFERRED EMBODIMENT

The present invention provides an apparatus for generating with a relatively small electricity a pulse line of magnetic force, wherein a diode is connected to a switching device, in other words, a controlled rectifier such as thyristor, in reverse parallel, or to a charge and discharge capacitance in parallel to cancel the negative voltage stored in the capacitance so that the peak charge current is suppressed to $\frac{1}{3}$, and also so that the quantity of electricity used to charge the capacitance is reduced to 1/2.5, in comparison with those of conventional apparatus.

More particularly, the present invention relates to an apparatus for generating a pulse line of magnetic force, characterized by connecting a diode in parallel to a capacitance or a controlled rectifier which is used to pass the discharge of the capacitance to a coil member for generating the pulse line of magnetic force so as to absorb the negative voltage produced by the series resonance of the capacitance and coil member.

The present invention will be explained with reference to the drawings.

FIG. 1 shows the circuit of conventional apparatus for generating a pulse line of magnetic force, wherein no diode is used. The current from power source B flows through resistance R and charges capacitance C. When triggering voltage G from low-frequency oscillator A is applied to the gate of thyristor SCR, capacitance C immediately discharges through coil L.

Figure 2:
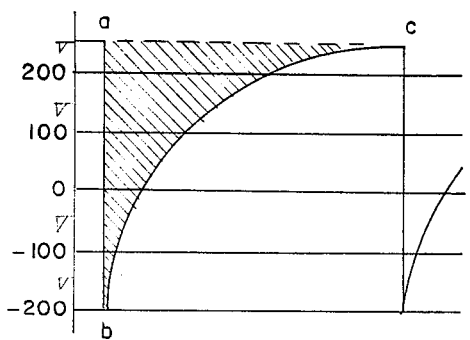
FIG. 2 shows the waveform of the voltage which appears in the circuit shown in FIG. 1.

The waveform at this point is as shown in FIG. 2. The charge voltage across capacitance C is 250 volts as shown in FIG. 2 with symbol "a". The triggering signal conducts thyristor SCR at the point shown with symbol "b", and the series resonance of coil L and capacitance C drops the voltage across capacitance C to −200 volts as shown with symbol "b". When thyristor SCR is turned to unconductive state, a current begins to flow into capacitance C through resistance R. The capacitance C at −200 volts is applied with +250 volts thereupon, and a considerably high current, shown in FIG. 2 with symbols "a", "b" and "c" and the oblique lines, rushes into capacitance C to bring the voltage across the capacitance to the starting level.

Figure 3:
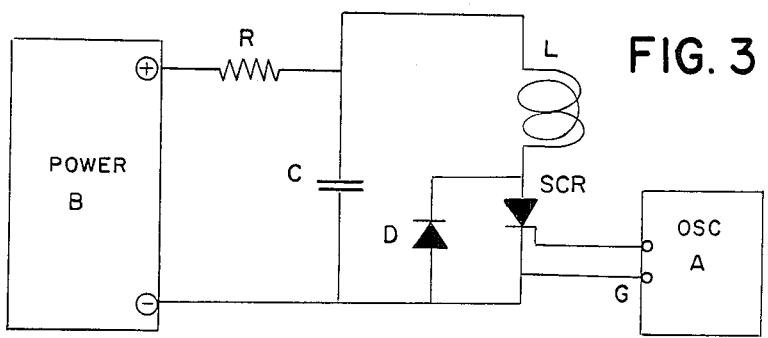
FIG. 3 shows the basic circuit diagram of the apparatus according to the invention.
Figure 4:
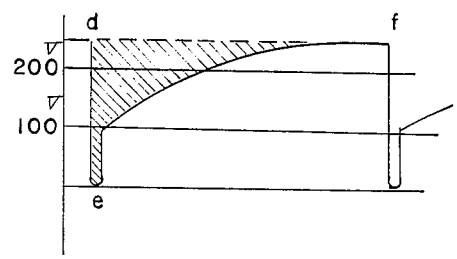
FIG. 4 shows the waveform of the voltage which appears in the circuit shown in FIG. 2.

FIG. 3 shows the circuit diagram of the apparatus according to the invention, wherein diode D is connected to thyristor SCR in reverse parallel. The voltage curve at the moment where capacitance C is discharged through coil L is as shown in FIG. 4. The conduction of thyristor SCR drops the voltage from the stationary level "d" to the level shown with symbol "e".

In conventional apparatus the voltage at the point shown with symbol "b" is −200 volts as shown in FIG. 2, while, in the apparatus according to the invention, the voltage at the point shown with "e" is zero as shown in FIG. 4 since diode D absorbs the negative voltage of the charge current. Since in the present apparatus the charge of the capacitance begins at zero potential level, the peak magnitude and amount of the charge current are extremely reduced to about $\frac{1}{3}$ and about 1/2.5 respectively in comparison with those of conventional apparatus. It can be understood that a very economical apparatus which can be driven with much less electricity is attainable by connecting the diode according to the invention.

Figure 5:
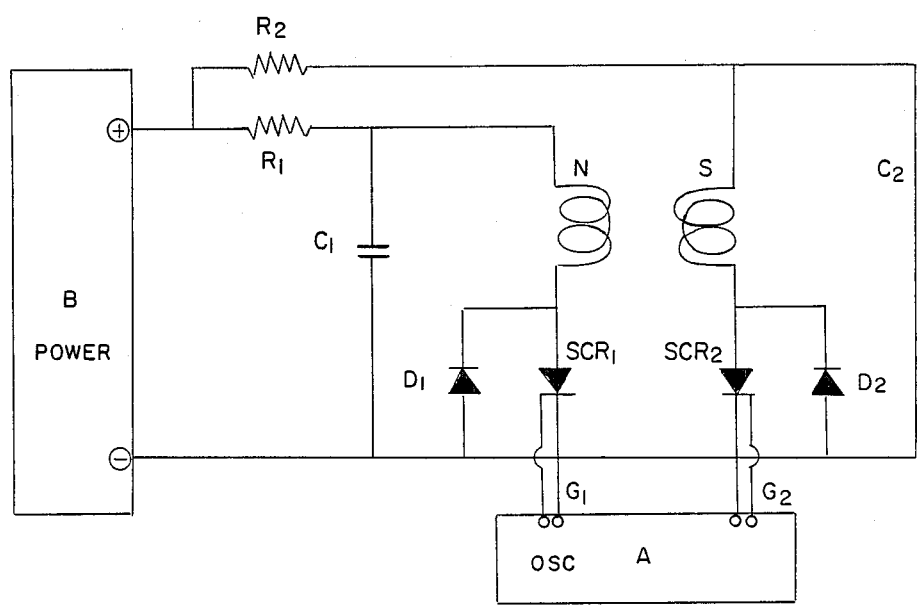
FIG. 5 shows the circuit diagram of an apparatus capable of generating an alternating pulse line of magnetic force.

Referring to the circuit as shown in FIG. 5, a set of the circuits as shown in FIG. 3 are used in combination so that one of the circuits generates a pulse line of magnetic force of one polarity at coil N, and that another circuit generates a pulse line of magnetic force of the opposite polarity at coil S. An alternating pulse line of magnetic force can be conveniently generated by alternately applying triggering signals $G_1$ and $G_2$ to thyristors $SCR_1$ and $SCR_2$ with low-frequency oscillator A.

Figure 6:
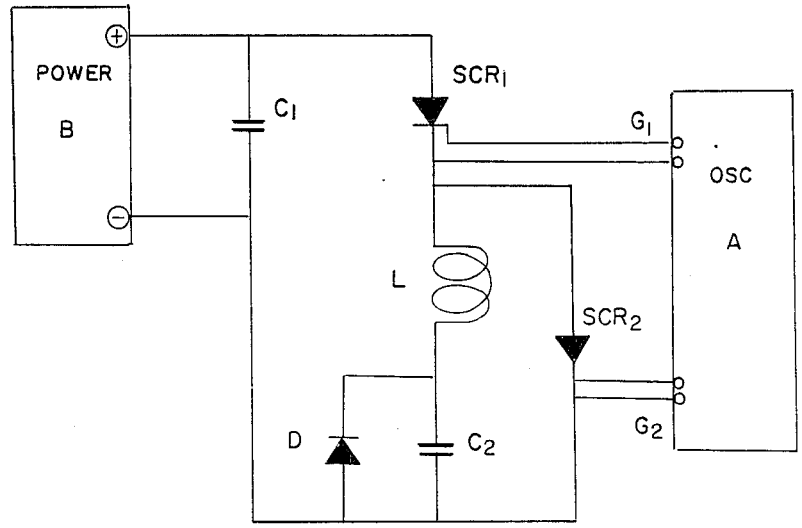
FIG. 6 shows circuit diagram of an embodiment wherein a charge and discharge capacitance is connected to a diode in parallel.

Referring now to the circuit in FIG. 6, power source B charges, in addition to capacitance $C_1$, capacitance $C_2$ through coil L on the conduction of thyristor $SCR_1$ through coil L, and capacitance $C_2$ is discharged through coil L on the conduction of thyristor $SCR_2$. This successive charge and discharge of capacitance $C_2$ alternately generates magnetic fields different in polarity because the current through coil L is reversed during charging and discharging capacitance $C_2$.

By connecting diode D in parallel to charge and discharge capacitance $C_2$, coil L can be driven with a relatively small charge current since the negative voltage generated by the series resonance of coil L and capacitance $C_2$ is absorbed by diode D.

As described above, an apparatus capable of generating the same output with less charge current is attainable by connecting the diode in parallel to the thyristor of capacitance in a circuit wherein a capacitance is discharged through a coil member in order to generate a pulse line of magnetic force.

While the described embodiments represent the preferred form of the present invention, it is to be understood that modifications will occur to those skilled in that art without departing from the spirit of the invention. The scope of the invention is therefore to be determined solely by the appended claims.

I claim:

1. An apparatus for generating pulses of magnetic flux, comprising:
    a power source,
    a low-frequency oscillator;
    a first capacitor charged by said power source;
    a first controlled rectifier triggered by said oscillator;
    a second capacitor connected in series with said controlled rectifier;
    a coil, connected in a series loop with said controlled rectifier and said second capacitor, said coil and said first capacitor together forming an LC resonant circuit;
    a diode connected in parallel with said second capacitor; and
    a second controlled rectifier connected in parallel across said coil and second capacitor, with polarity opposite that of said first diode, and connected to said low-frequency oscillator to be triggered after the triggering of said first controlled rectifier;
    whereby the peak charge current required from said power source and the electricity used to charge said first capacitor can be substantially reduced.

2. The apparatus of claim 1,
    wherein each said controlled rectifier comprises a thyristor, each said thyristor having a conduction mode and a non-conduction mode,
    whereby when said oscillator triggers the conduction mode of said first thyristor, said first capacitor discharges through said coil to thereby cause pulses of magnetic flux.

* * * * *